United States Patent [19]

Amstutz et al.

[11] Patent Number: 4,705,359
[45] Date of Patent: Nov. 10, 1987

[54] PROCESS AND APPARATUS FOR THE PRODUCTION OF AN ORIENTATION LAYER ON A PLANE SURFACE OF A PLATE, AND LIQUID CRYSTAL SUBSTRATE PLATE PRODUCED THEREBY

[75] Inventors: Hermann Amstutz, Mellingen; Meinolph Kaufmann, Baden; Jürgen Nehring, Wettingen; Terry J. Scheffer, Forch, all of Switzerland

[73] Assignee: BBC Brown, Boveri & Company, Limited, Baden, Switzerland

[21] Appl. No.: 704,775

[22] Filed: Feb. 25, 1985

[30] Foreign Application Priority Data

Mar. 2, 1984 [DE] Fed. Rep. of Germany ....... 3407794
Jul. 4, 1984 [DE] Fed. Rep. of Germany ....... 3424530

[51] Int. Cl.$^4$ ............................................. G02F 1/133
[52] U.S. Cl. ..................................... 350/341; 350/320
[58] Field of Search ................. 350/341, 320; 427/35, 427/108, 109, 126.2; 118/729, 686

[56] References Cited

U.S. PATENT DOCUMENTS

| | | | |
|---|---|---|---|
| 3,046,839 | 7/1962 | Bird et al. ............................ | 350/320 |
| 3,962,448 | 6/1976 | Gillery ................................ | 427/109 |
| 3,962,488 | 6/1976 | Gillery ................................ | 427/109 |
| 4,043,647 | 8/1977 | Oue et al. ............................ | 350/341 |
| 4,370,194 | 1/1983 | Shaver et al. ........................ | 350/336 |

OTHER PUBLICATIONS

Meyerhofer "New Technique of Aligning Liquid Crystals on Surfaces" Appl. Phys. Lett. vol. 29, No. 11, Dec. 1976, pp. 691-692.
Koshida "Large-Area Quasihomeotropic Orientation of Liquid Crystal and Its Application to Guest-Host Positive Display" J. Appl. Phys. 52(9) Sep. 1981, pp. 5534-5536.
Goodman et al "Topology of Obliquely Evaporated Silicon Oxide Films and its Effect on Liquid Crystal Orientation IEE Trans. on Electron Devices vol. Ed. 24 No. 7, Jul. 1977, pp. 795-804.
Koki "Controlled High-Tilt-Angle Nematic Alignment Compatible with Glass Frit Sealing" Jap. Appl. Phys, Lett. pp. L761-L763, Dec. 82, vol. 21, No. 12.

Primary Examiner—John K. Corbin
Assistant Examiner—David Lewis
Attorney, Agent, or Firm—Oblon, Fisher, Spivak, McClelland, & Maier

[57] ABSTRACT

A process and apparatus for the production of an orientation layer on a plane surface of a plate, and a liquid crystal substrate plate produced thereby. By the process of evaporation from a source, orientation layers are deposited on the plane surfaces of a plurality of liquid crystal substrate plates used for application in liquid crystal displays. To obtain a uniform orientation of the optic axis of the liquid crystal with regard to the azimuthal alignment by means of the preferred direction caused by the orientation layer on the surface, the plates are moved in a direction crosswise to the evaporation direction during the evaporation process. The field of the particle stream emanating from the source is limited by an aperture in an aperture screen which is introduced between the source and the plates. The plates pass completely through the particle stream during the course of the evaporation operation. The finished plates include an approximately 5 nm thick orientation layer. In the apparatus, the plates are held in a wagon which is moved along rails by means of a toothed rack and a toothed pinion.

10 Claims, 12 Drawing Figures

PROCESS AND APPARATUS FOR THE PRODUCTION OF AN ORIENTATION LAYER ON A PLANE SURFACE OF A PLATE, AND LIQUID CRYSTAL SUBSTRATE PLATE PRODUCED THEREBY

BACKGROUND OF THE INVENTION

1. Field of the Invention

This invention relates to a process for the production of an orientation layer on a plane surface of a plate. The invention also pertains to an arrangement for implementing this process as well as to a liquid crystal substrate plate.

2. Discussion of Background

A process for producing an orientation layer on a plane surface of a plate, wherein the plane surface is exposed to a diverging particle stream impinging on the surface at an angle of incidence other than 0°, is known from U.S. Pat. No. 3,834,729.

Such a process is especially suitable for the production of orientation layers on the substrate surfaces facing the liquid crystal substance in liquid crystal displays. For example, through the oblique evaporation of SiO on the surfaces, structures are produced which approximate arrangements of slanting, column-like elements (see L. A. Goodman et al.: Topography of Obliquely Evaporated Silicon Oxide Films and its Effect on Liquid Crystal Orientation, IEEE Transactions on Electron Devices, Vol. ED-24, No. 7, 1977, pp. 795-804). These structures orient the optic axis of the liquid crystal on the boundary layer adjacent to the substrate surface parallel to a preferred direction and thereby, on the basis of the coherence inside the liquid crystal, essentially control the configuration in the whole display cell.

In the manufacturing process known from U.S. Pat. No. 3,834,792, the substrate plates to be coated are arranged in a vacuum apparatus in pairs above an evaporation source, which is essentially a point source, so that the particle stream emanating from the source impinges upon the surfaces of the plates with an angle of incidence of about 80° measured with respect to the plate normal. The relative spatial position of the plates and the source does not change during the evaporation operation.

The preferred direction of the optic axis at every point on the surface, which is determined by the orientation layer, not only depends on the thickness of the orientation layer but is also especially sensitive to the incident direction of the particle stream emanating from the source. The pretilt angle between the preferred direction and the surface depends upon the angle of incidence of the particle stream (see: T. J. Scheffer and J. Nehring: Accurate determination of liquid-crystal tilt bias angles, J. Appl. Phys., Vol. 48, No. 5, 1977, pp. 1783-1792). The azimuthal orientation of the preferred direction, on the other hand, coincides with that of the incident particle stream, and because of the spatial divergence of the particle stream, a uniform alignment of the preferred direction over the surface of the entire plate can only be achieved by this means if the separation between the evaporation source and the surface is very large in comparison with the dimensions of the plate.

Such a uniformity is, at least regarding the azimuthal orientation (nonuniformity in the pretilt angle has a lesser effect) absolutely necessary in order to achieve satisfactory optical properties of the liquid crystal display.

For example, in order to produce an orientation layer having a tolerable azimuthal variation of less than 5° in a large area matrix display with 192 points×280 points and an active area of about 14 cm×20 cm, a source-substrate separation of more than 230 cm would be required using the known process. This kind of separation can be realized only in large vacuum chambers with correspondingly increased installation costs, longer pumping times and low plate throughputs.

The known process and the usual evaporation distances of about about 30 cm which are attainable in the smaller vacuum chambers lead to a variation in the azimuthal orientation of about 30° for plates with the dimensions given above. Variations on this order with the accompanying variations in twist angle of the liquid crystal layer, however, cause unacceptable variations in the color, operating voltage and response time in the finished display cell.

In another known process (N. Koshida: Large-area quasihomeotropic orientation of liquid crystal and its application to guest-host positive display, J. Appl. Phys., Vol. 52, No. 9, 1981 pp. 5534–5536) an extended source having a length of about 40 mm is used instead of the point source. It is clear, however, form geometrical considerations that only an infinitely extended source can lead to a really uniform azimuthal orientation of the preferred direction over the entire evaporated surface. A truncated linear extension of the source can only moderate the nonuniformities. In addition, extending the source increases the nonuniformities in the particle stream density and interferes with the use of an electron beam evaporation process.

A further process is know (K. Hiroshima: Controlled High-Tilt-Angle Nematic Alignment Compatible with Glass Frit Sealing, Jpn. J. Appl. Phys., Vol. 21, No. 12, 1982, pp. L761-L763), by which the substrate plate is rotated with an angle-dependent speed so that the azimuthal angle of the particle stream impinging on the plate surface continually changes.

Notwithstanding the fact that a completely uniform azimuthal orientation of the preferred direction over large plates with relatively short source-plate separations cannot be achieved in this manner, the necessary equipment to implement this process is complicated and costly since every plate must have its own rotatable holder and controlled drive. The number of plates that could be evaporated on in a single operation is therefore small.

Finally, a process for the selective coating of polarizer plates having parallel grooves is known from U.S. Pat. No. 3,046,839, in which the grooves are coated on one side with a metal layer by means of an obliquely impinging particle stream which forms the grid wires of the polarizer. In order to be able to coat the sides of the grooves as evenly as possible with respect to thickness and area, an aperture is provided between the source and the plate which limits the field of the particle stream. The plate is moved through this stream in a direction essentially parallel to the particle stream during the evaporation operation. The evaporated metal layer merely has the function of providing an opaque layer. To be sure, a uniform angle of incidence results from the displacement which is essentially parallel to the particle stream, but the azimuthal variation of the incident direction over the area of the plate remains unchanged. Applying this known process for the production of an orientation layer for liquid crystals would bring no improvement especially with regard to the important azimuthal orientation.

SUMMARY OF THE INVENTION

Accordingly, one object of this invention is to provide a novel process by which an orientation layer with uniform alignment of the preferred direction, especially in regard to the azimuthal orientation, can be produced on large area surfaces without much separation between the source and the surface.

A further object of this invention is to provide a cost-effective, manufacturable arrangement to implement this process as well as to supply a liquid crystal substrate plate produced according to this process.

These and other objects are achieved according to the invention by providing novel process for the production of an orientation layer on a plane surface of a plate, an apparatus for implementing this process and a liquid crystal substrate plate produced by the process, wherein by the process of evaporation from a source, orientation layers are deposited on the plane surfaces of a plurality of liquid crystal substrate plates used for application in liquid crystal displays. For the purpose of obtaining a uniform orientation of the optic axis of the liquid crystal with regard to the aximuthal alignment by means of the preferred direction caused by the orientation layer on the surface, the plates are held in a vehicle which is moved along rails by means of a toothed rack and a toothed pinion gear in a direction crosswise to the evaporation direction during the evaporation process. The field of the particle stream emanating from the source is limited by an aperture in an aperture screen which is introduced between the source and the plates. The plates pass completely through the particle stream during the course of the evaporation operation. The finished plates consist of a 0.7 mm or 1.1 mm thick glass carrier plate which is covered with a 7 nm thick quartz blocking layer, which in turn is covered by a 120–130 nm thick structured electrode layer of $In_2O_3$, which in turn is covered by a 2–150 nm thick polyimide protective layer, and finally which is covered with an approximately 5 nm thick orientation layer. 6 μm diameter spacer elements can be deposited in the protective layer or in a carrier layer provided under the protective layer.

The advantages achieved through this invention are mainly to be seen in that, with regard to the azimuthal angle, all points on the evaporated surface are exposed to the impinging particle stream in exactly the same way. This results in a complete uniformity in the azimuthal orientation of the preferred direction of the optic axis of the liquid crystal on the orientation layer. The size of the plates is therefore limited in one direction only by the dimensions of the vacuum chamber. The separation between the source and the edge of the plate nearest the source is small enough that this need not be a consideration in determining the size of the vacuum chamber.

Furthermore, with the inventive process a relatively large number of plates can be evaporated on at the same time in a single operation, which considerably increases the economy of this process.

The inventive arrangement for implementing this process distinguishes itself through its simplicity and stability. It can also be manufactured at a moderate price.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 shows a front view of the arrangement of FIG. 2a;

FIG. 4b is a front view of the schematic illustration of FIG. 4a;

FIG. 6b is a top view of the preferred aperture shape for the arrangement according to FIG. 6a;

FIG. 7 is a graph showing the deformation of the curved plates as a function of plate length for the arrangement of FIG. 6a;

FIGS. 8 and 9 are cross-sectional views of the layered structure of a liquid crystal substrate plate according to FIGS. 1–6a.

DESCRIPTION OF THE PREFERRED EMBODIMENTS

Figure 1:
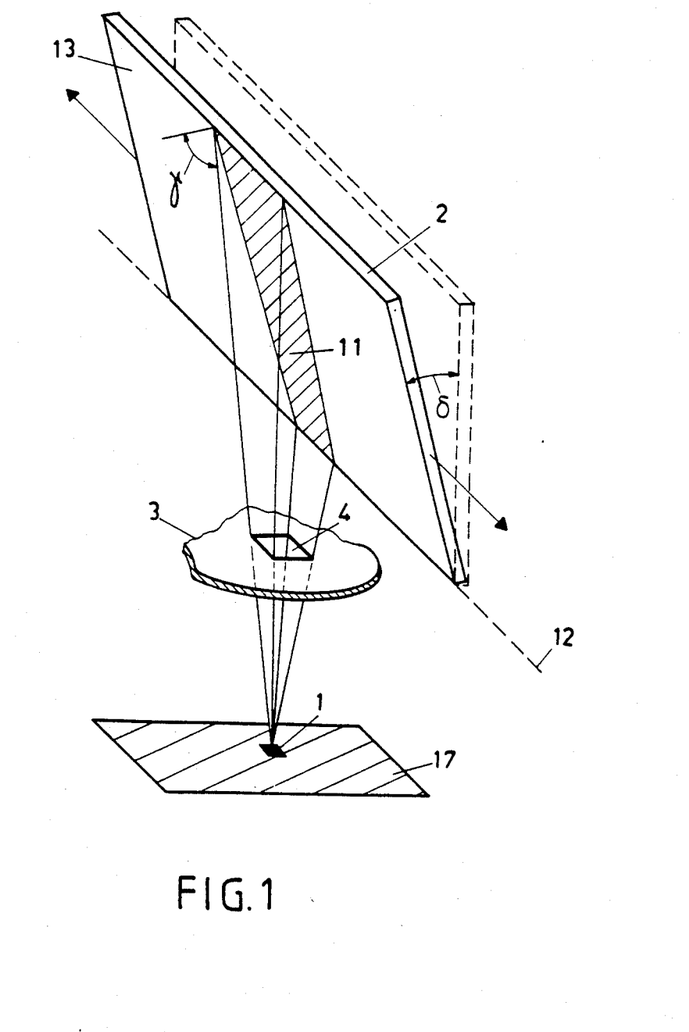
FIG. 1 is a perspective view of the geometrical arrangement of source, aperture and plate of the inventive process.

Referring now to the drawing, wherein like reference numerals designate idential or corresponding parts throughout the several views, and more particularly to FIG. 1 thereof, the geometrical configuration for the implementation of the inventive process is illustrated by the perspective view shown in FIG. 1. This figure shows the evaporation source 1 (preferably a point source) lying in the source plane 17. Parallel and at some distance from the source plane 17 is the aperture screen 3 (shown only partially drawn) with the aperture 4 which, for the purposes of simplicity, is illustrated as a square opening. A particle stream emanating from the source 1, whose field is limited by the aperture 4, impinges on the surface 13 of a plate 2 which is located above the aperture screen 3.

The plate 2 is tilted from an original configuration perpendicular to the source plane 17 (shown by the dashed line) by a tilt angle δ about a tilt axis 12 so that the surface 13 is facing the source 1.

The source 1, which contains SiO, $SiO_2$, $TiO_2$, $MgF_2$, $Al_2O_3$ or other material suitable for the production of orientation layers, is caused to emanate a particle stream by a resistance heater or an electron beam. Other processes for the generation of a particle stream are also conceivable, in so far as the resulting stream is suficiently directed and impinges upon the surface 13 of the plate 2 at a well-defined angle of incidence.

The plate 2 is positioned so that the particle stream impinges everywhere on its surface 13 with an angle of incidence $\gamma \neq 0°$, whereby the angle of incidence $\gamma$ has its usual definition as the angle between a ray of the particle stream and the normal to the plate.

According to this invention the plate 2 and the source 1 are moved relatively to each other at a constant velocity from a first position to a second position in a direction which is essentially crosswise to the particle stream. One way to achieve this relative displacement is to hold the plate 2 in a fixed position and move the system consisting of the source 1 and the aperture screen 3. Achievement of the displacement in this way, however, requires flexible high-current conductors if the source uses resistive heating. It is therefore preferred to achieve the displacement in another way by moving the plate 2 while holding the source 1 and the aperture screen 3 in their fixed positions.

In one preferred embodiment of the inventive process the displacement of the plate 2 takes place along a straight line which runs parallel to the tilt axis 12 and therefore also runs parallel to the source plane 17, as indicated by the arrow drawn in FIG. 1.

The aperture 4, e.g. a slit-like opening of constant width, lets through a particle stream whose field is limited on both sides in the displacement direction in such a way that the plate 2 lies outside the particle stream in the first and second positions and passes completely through the particle stream during the course of the displacement. For a plate at some intermediate position between the first and second positions, the particle stream, as it is illustrated in FIG. 1, impinges on only a portion 11 of the surface 13. In an extreme case this portion 11 can also become identical with the whole surface 13.

Figure 2A:
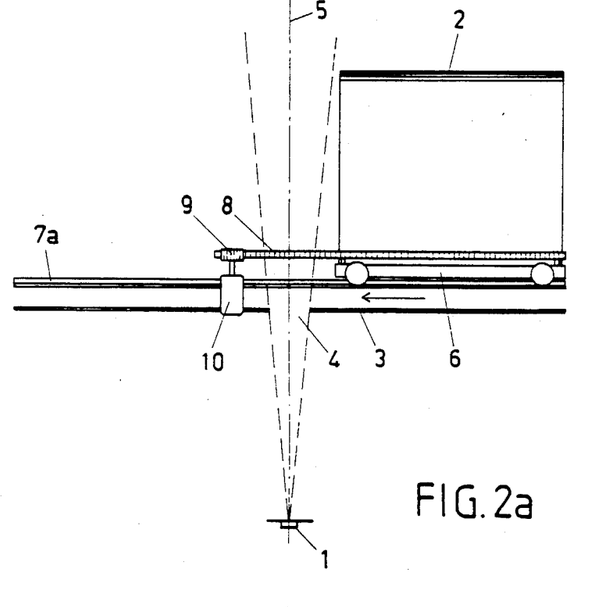
FIG. 2a is a side view of a preferred embodiment of the inventive arrangement for implementing this process at the beginning of the operation.
Figure 2B:
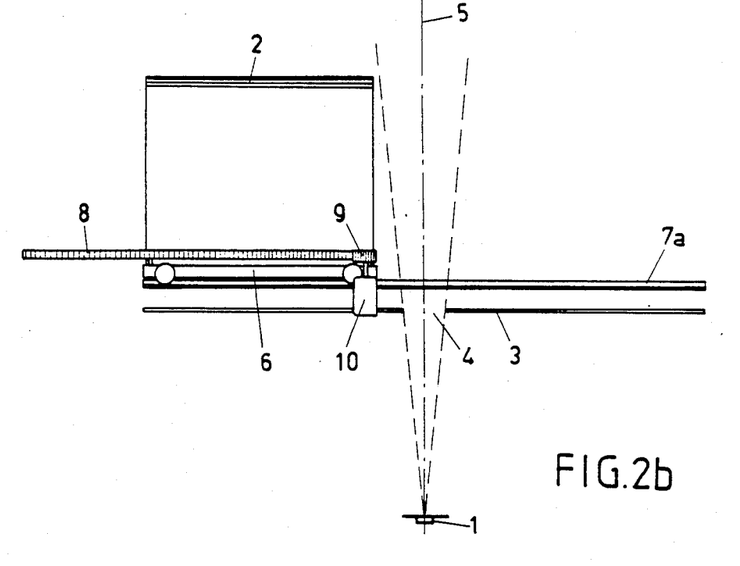
FIG. 2b is a side view of the same arrangement at the end of the operation.

The first and the second positions between which the plate is moved are illustrated in FIGS. 2a and 2b in connection with one embodiment of the arrangement for the implementation of the process. Above the source 1 and the aperture screen 3 with the aperture 4 is a plurality of plates 2 arranged one after the other crosswise to the displacement direction in two fan-shaped arrays on a wagon 6 which can be moved along two rails (only one of which is visible in FIG. 7a). The wagon 6 has a toothed rack 8 extending in the displacement direction which engages with a toothed pinion gear 9. The toothed pinion gear 9, driven by an electric motor 10, causes the displacement of the wagon 6 with the plates 2.

The aperture 4 in the arrangement shown preferably lies symmetrically to the mid-plane 5 which passes through the source 1 and runs perpendicularly to the displacement direction and thus also to the tilt axis 12 in FIG. 1.

Figure 3:
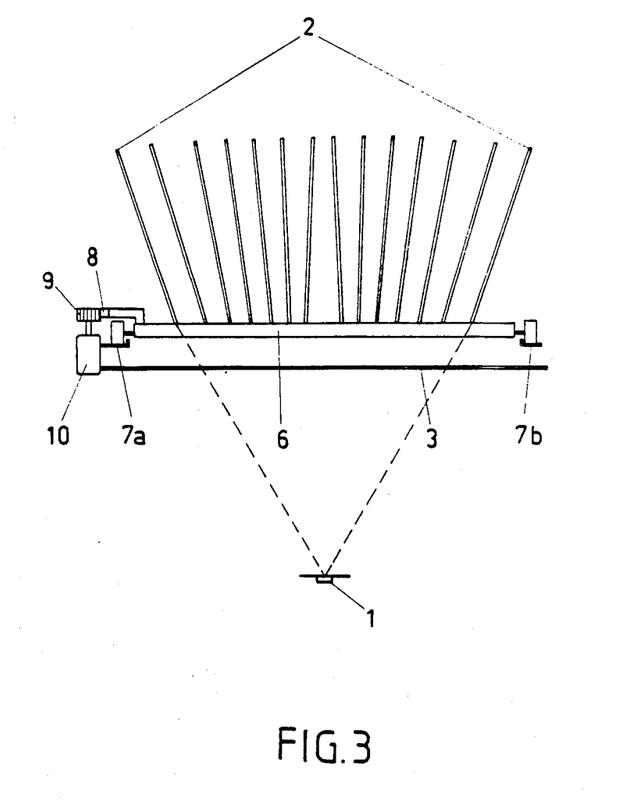

FIG. 3 shows a front view of the arrangement illustrated in FIGS. 2a and 2b, i.e. seen in the displacement direction. The two fan-shaped arrays of seven plates 2 each are clearly visible between the two rails 7a and 7b. Each plate is precisely positioned and tilted with respect to the source 1 so that its surface is fully illuminated by the particle stream and does not cast a shadow on a neighboring plate.

Figure 4A:
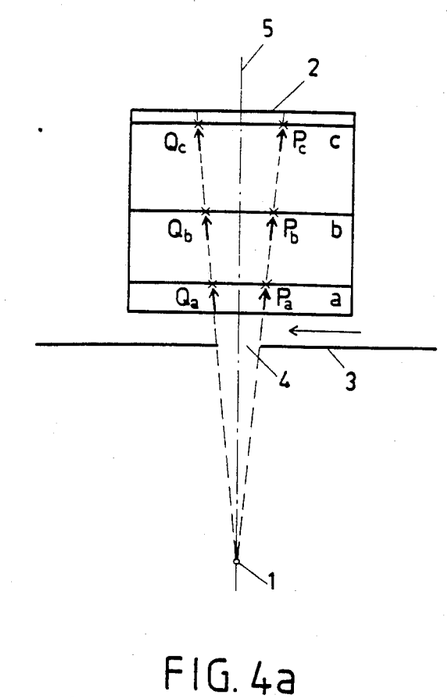
FIG. 4a is a schematic side view of an illustration of the implementation of the inventive process and which explains the azimuthal orientation.

Every point on the plate 2 lies on some line in the plane of the plate that runs parallel to the displacement direction, indicated in FIG. 4a, for example, by the lines a, b and c. During the movement of the plate 2 through the particle stream, a point lying on the lines a, b or c enters the particle stream at the locations $P_a$, $P_b$ or $P_c$ and leaves it again at the locations $Q_a$, $Q_b$ or $Q_c$. By this means all points lying along the same line are exposed to exactly the same succession of overlapping incident directions of the impinging particle stream. This assures a perfectly uniform formation of the orientation layer along these lines.

Figure 4B:
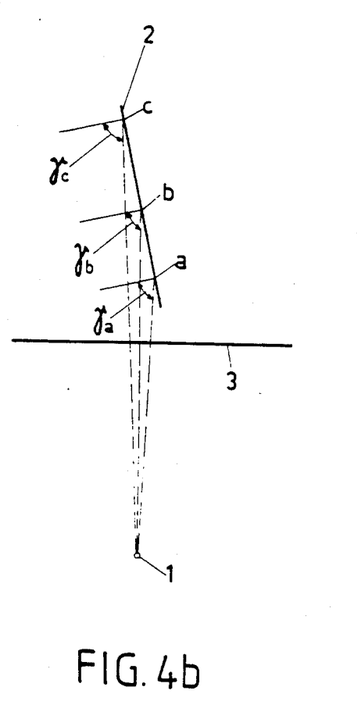

If the points lie on different lines, then the corresponding angles of incidence $\gamma_a$, $\gamma_b$ and $\gamma_c$ will be different. The relationship $\gamma_a < \gamma_b < \gamma_c$ is seen to hold from FIG. 4b. With a constant aperture width, the incident direction, however, runs through exactly the same azimuthal angles regardless of the location on the plate. Points farther away from the source 1, such as those points lying on the line c, just take a longer time to pass through the stream than do points lying nearer to the source such as the points lying on the line a. By this means a uniform formation of the orientation layer is obtained over the entire surface of the plate 2 with respect to the azimuthal orientation of the preferred direction of the optic axis of the liquid crystal.

EXAMPLE

In a standard vacuum chamber of the type BA-710 from the Balzers Company SiO was evaporated on two 24 cm×20 cm substrate plates through a 4 cm wide aperture in an arrangement shown in FIGS. 2a and 2b. The separation between the source and the 24 cm long lower edge of the substrate plate was about 30 cm in this case. The orientation layer was evaporated in about 8 minutes using a displacement speed of 4 cm/min. With this geometry an observer sitting on the substrate surface would see the source making an arc of about 8°.

The small differences in angle of incidence $\gamma$ result at most in equally small deviations of the angle between the optic axic of the liquid crystal on the orientation layer and the plane of the layer, i.e. the pretilt angle. These deviations have a markedly small influence on the electro-optical properties of the finished liquid crystal display.

Even though the relative displacement between plate 2 and source 1 of this invention produces an azimuthal orientation of the evaporated orientation layer which is completely uniform over the whole area of surface 13, there still remain variations in the angle of incidence $\gamma$ (see FIG. 4b) and in particular there remain variations in the thickness of the evaporated layer. These latter variations originate from the characteristic intensity distribution of the particle stream emanating from the source 1 as well as from the variations in the source-plate distance.

Consider the practical case of a 35.5 cm×35.5 cm (14 inch×14 inch) substrate plate that is positioned with respect to the source so that the angle of incidence for the part of the particle stream impinging on the center of the plate, which is 64 cm away from the source, is 85°. For this case the evaporated layer thickness increases by a factor of three and the angle of incidence decreases from 86.1° to 83° in going from the upper to the lower edge of the plate.

According to a further development of the inventive process, in order to reduce or even eliminate the variation in the angle of incidence $\gamma$, the plate 2 is bowed out concave with respect to the source 1 and held in this position during the displacement operation. The essential geometrical parameters for the evaporation on a curved substrate plate are reproduced in FIG. 5.

Figure 5:
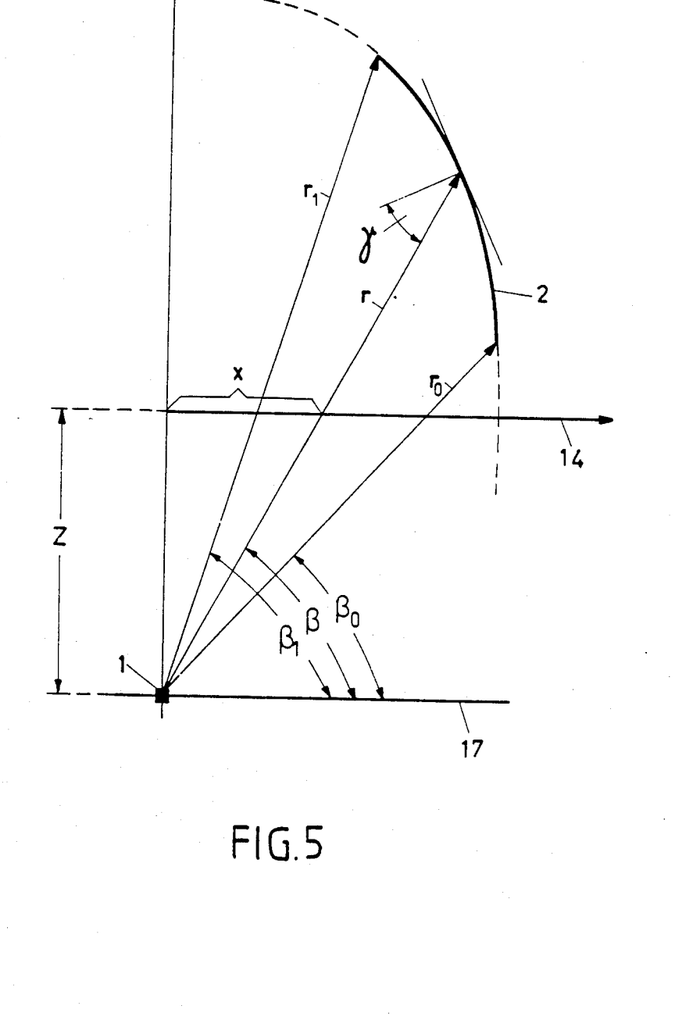
FIG. 5 is a schematic illustration of the essential geometrical parameters for evaporating onto a curved plate.

The source 1 lying on the source plane 17 emits a particle stream which impinges upon the curved plate 2.

FIG. 5 shows the arrangement in a cut through the mid-plane 5. The upper peripheral ray of the particle stream impinging on the upper edge of the plate makes an angle $\beta_1$ with the source plane 17 and travels a distance $r_1$. The lower peripheral ray impinging on the lower edge has corresponding values $\beta_0$ and $r_0$. In the same manner every ray of the particle stream lying between these two peripheral rays can be assigned an angle $\beta$ and a distance r as well as an angle of incidence $\gamma$ which is defined with respect to the normal to the tangent to the curved plate 2 at the point of impact.

An aperture plane 14 is also introduced in FIG. 5. The point of intersection of the aperture plane 14 with the particle stream ($\beta$,r) defines a linear parameter x which locates the position of the particle stream in this plane. The requirement for the angle of incidence $\gamma$ to be independent of the parameters r, $\beta$ or x leads to the equation for a mathematical curve known as a logarithmic spiral. Using the polar coordinates $\beta$ and r already defined, this curve can be written as follows:

$$r = r_o \exp((\beta - \beta_o)/\tan(90° - \gamma)), \quad (1)$$

where the coordinates $r_o, \beta_o$ are assigned to the point of impact of the lower peripheral ray on the lower edge of the plate and serves as a fixed reference point.

The polar coordinates $r_1, \beta_1$ for the point of impact of the upper peripheral ray on the upper edge of the plate are obtained from the condition that the line integral over a segment of the logarithmic spiral defined by eq. (1) must be equal to the height h of the plate 2:

$$\beta_1 = \beta_o + \tan(90° - \gamma) \ln(1 + (h \cos(90° - \gamma))/r_o) \quad (2)$$

$$r_1 = r_o \exp((\beta_1 - \beta_o)/\tan(90° - \gamma)). \quad (3)$$

From eqs. (1), (2) and (3) for a given plate height and angle of incidence $\gamma$ the corresponding positions and curvatures for a plurality of plates arranged in the fan-shaped arrays shown in FIG. 3 can be computed. The results of such a computation for fourteen plates 2 is reproduced in FIG. 6a.

Figure 6A:
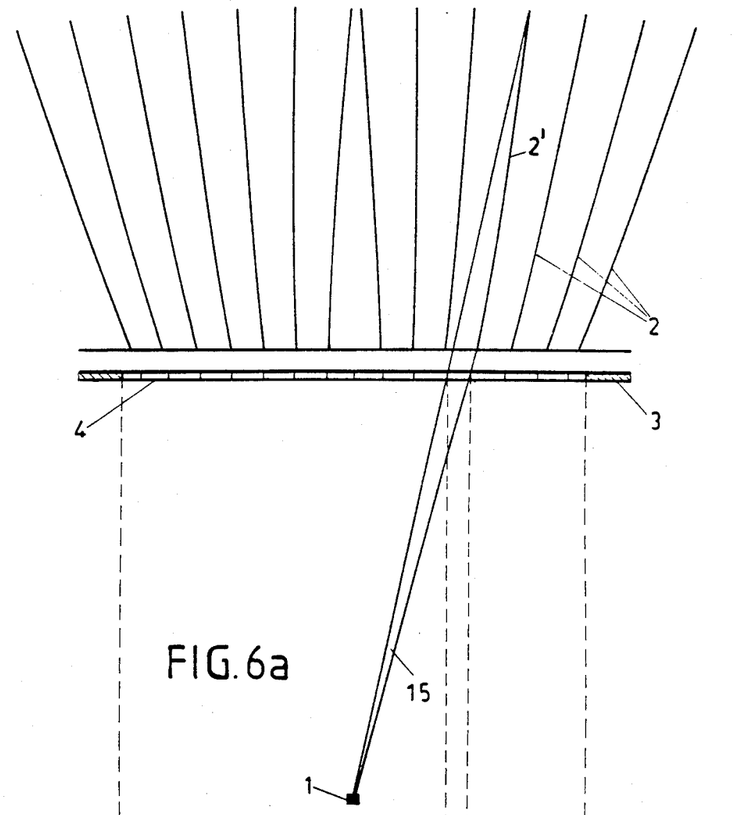
FIG. 6a is a schematic front view of an arrangement of an array of curved plates according to a further development of the invention.

As is noted from FIG. 6A, the degree of curvature for the plates required for a uniform angle of incidence $\gamma$ ($\gamma = 85°$ in the example of FIG. 6a) is small. This is especially clear from FIG. 7 in which the deviation D from a straight line of the fourteen 35.5 cm long plates of FIG. 6a is plotted on an enlarged scale as a function of the length L. Seven different curvature profiles are obtained, corresponding to the partitioning of the fourteen plates into two symmetric divisions of seven plates each. The amount that the plates have to be bowed out increases from the outermost to the innermost plates and amounts to at most about 2 mm.

Figure 7:
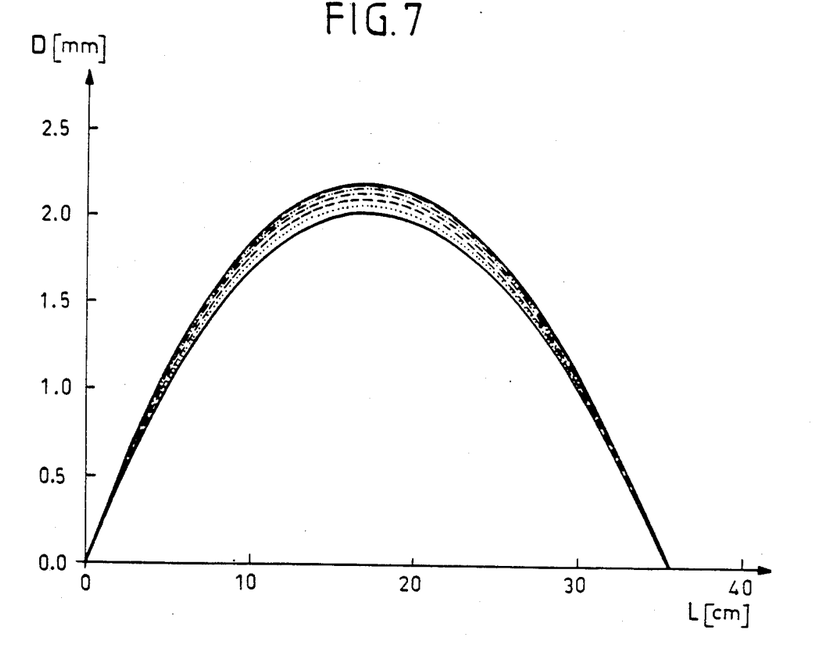

It is no problem to obtain the maximum deviation of 2 mm shown in FIG. 7 because 0.7 mm thick glass plates are generally used as substrate plates and, for the 35.5 cm dimensions given, these can be bowed out at the middle by more than 15 mm without difficulty.

The position and curvature of the plates 2 in FIG. 6a can be held for the evaporation operation by attaching vertical holders to the sides of the plates. This can be accomplished by milling correspondingly curved grooves in the holders into which the plates 2 are inserted. The holders themselves are mounted on a wagon as shown in FIG. 3 which, for the purposes of clarity, is not shown in FIG. 6a.

A further development of the inventive process takes into consideration the variation in the source-plate distance as well as the characteristic intensity distribution of the particle stream emanating from the source 1. This intensity distribution can be approximated by a cos $(90° - \beta)$ law where $\beta$, as before, is the polar angle as defined in FIG. 5. With this law, and assuming a constant angle of incidence, the following proportionality is valid for the thickness d of the evaporated layer:

$$d \sim (w/r) \sin \beta, \quad (4)$$

where r is the radius defined in FIG. 5 and w is the width of the aperture at the place on the aperture plane 14 determined by the parameter x from FIG. 5.

According to eq. (4), in order to obtain an orientation layer of constant thickness the width w must be proportional to $r/\sin \beta$. Using this relationship and rewriting eq. (1) one obtains:

$$w(x) = k(1 + x^2/z^2)^{\frac{1}{2}} \exp((\tan^{-1}(z/x) - \beta_o)/\tan(90° - \gamma)) \quad (5)$$

where k is an normalization factor and z is the distance between the source plane 17 and the aperture plane 14. The normalization factor limits the maximum width of the aperture to practical values, e.g. 70 mm.

Figure 6B:
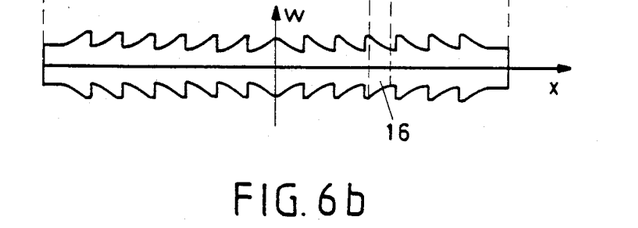

A top view of the aperture 4 in the aperture screen 3 of FIG. 6a, computed according to eq. (5), is illustrated in FIG. 6b. The total aperture is divided into sub-regions 16. Each of the fourteen plates 2 is assigned its own sub-region 16, which limits the field of its corresponding part 15 of the whole particle stream. The sub-region 16 belonging to a selected plate 2' is indicated in FIG. 6b by the vertical dashed lines. The width w inside each of the sub-regions 16 as a function of the linear coordinate x in the aperture plane 14 is given by eq. (5). For convenience all sub-regions 16 are connected together into one large aperture 4 by providing saw-toothed transitions between neighboring sub-regions. In addition, it is noted from FIG. 6b that the width w of the outer sub-regions is somewhat larger than that of the inner sub-regions because the associated plates are correspondingly farther way from the source 1 and the intensity of the source decreases with decreasing values of $\beta$.

A proportionality deviating from eq. (4) is obtained under the assumption that the plates are not deformed according to a logarithmic spiral but rather are held flat during the evaporation (see FIG. 3), i.e. the angle of incidence $\gamma$ is not constant:

$$(6) \quad d \sim (w/r^2) \sin \beta r_m \cos \gamma_m. \quad (6).$$

$r_m$ and $\gamma_m$ are the distance and the angle of incidence of a ray of the particle stream that lies in the mid-plane 5 and impinges on the surface 13 of the plate 2 on the horizontal mid-line of the plate.

The condition for a constant thickness d leads in this case to the following proportionality between the width w and the other parameters:

$$w \sim (r^2/\sin \beta)(1/(r_m \cos \gamma_m)). \quad (7)$$

In general, the inventive process makes possible the production of an orientation layer with a completely uniform azimuthal orientation. Further developments of the inventive process also eliminate the variation in the angle of incidence as well as in the thickness of the evaporated layer. By this simple means large area substrate plates for liquid crystal displays can be provided with orientation layers which are uniform with respect to all parameters. Liquid crystal displays provided with such orientation layers exhibit completely uniform optical and electrooptical properties.

Figure 8:
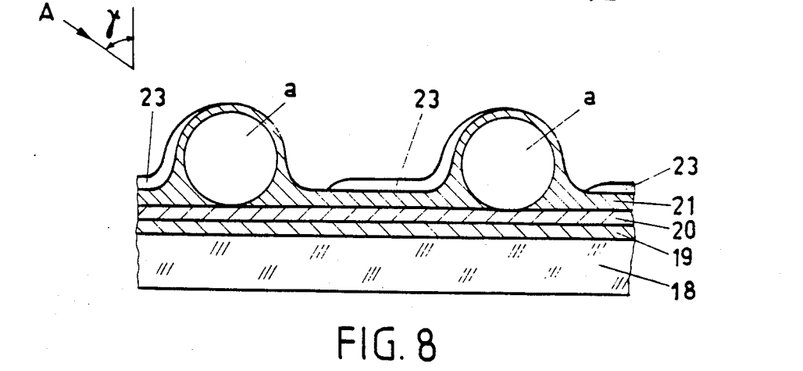

The layered structure of a flat liquid crystal substrate plate 2 is noted from FIG. 8, (not drawn to scale). A quartz blocking layer 19 with a thickness in the range 10 nm-200 nm, and preferably 70 nm, is deposited on a glass electrode carrier plate 18 having a thickness in the range of 0.5 mm to 1.5 mm, and preferably either 0.7 mm or 1.1 mm. The blocking layer 19 should prevent or at least reduce the migration of sodium ions.

A structured conductor or electrode layer 20, preferably of $In_2O_3$ doped with 5%-10% $SnO_2$, is located on top of this blocking layer 19. The thickness of the electrode layer 20 lies in the range of 20 nm-300 nm, preferably in the range from 120 nm-130 nm.

A protective layer 21 is located over the electrode layer 20 and consists of a polymer such as polyamide, polyvinyl alcohol, and preferably polyimide or polyimidamide which is deposited on the electrode layer 20 by an offset, tampon or preferably a silk-screen printing process. The thickness of this polymer layer 21 lies in the range of 50 nm-100 nm. The electrode layer 20 has a surface resistance of less than 100 $\Omega/\square$ (i.e. the resistance of a square piece of the surface). This polymer layer 21 produces a good blocking layer and assures a long lifetime for the liquid crystal display.

Spacer elements a, preferably glass fibers of lengths 20 $\mu$m-100 $\mu$m and diameters in the range of 2 $\mu$m-10 $\mu$m, preferably in the range 5 $\mu$m-8 $\mu$m, are embedded in the protective layer 21. They assure a constant separation between the two glass plates of a liquid crystal cell The orientation layer 23 consisting of one of the materials mentioned at the beginning is deposited on the protective layer by means of oblique evaporation from a direction of incidence A under an angle of incidence $\gamma$. By the evaporation process one achieves a high-tilt orientation of the liquid crystal molecules on the layer at an angle of 20° ... 30° with respect to the plane of the layer. Without the orientation layer 23 a tilt angle of the liquid crystal molecules near the surface of only approximately 1° can be achieved by applying the usual rubbing techniques to the protective layer 21.

The thickness of the orientation layer 23 lies in the range of 2 nm to 20 nm. The orientation layer is missing in the shadows of the spacer elements a; the liquid crystal orientation is disturbed there. Macroscopically, however, these missing areas of orientation layer do not disturb the operation of the display.

Figure 9:
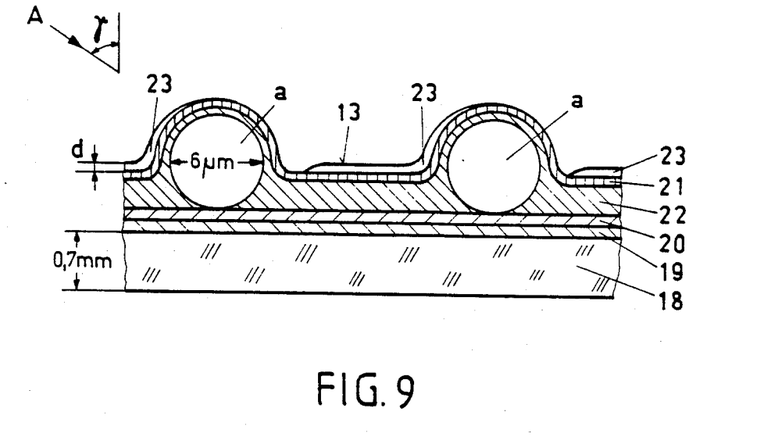

The layered structure shown in FIG. 9 has, in addition to the structure of FIG. 8, an oxide carrier layer 22, preferably $Gd_2O_3$, for the fixation of the spacer elements a. The thickness of this carrier layer lies in the range of 50 nm-100 nm and is deposited in a silk-screen printing process as gadolinium nitrate with an organic binder. The protective layer 21 is deposited by spinning in this case; its thickness lies in the range of 2 nm-10 nm.

The spacer elements a can be deposited in or on top of the orientation layer 23 in the embodiment of FIG. 8 as well as that of FIG. 9. Glass beads can also be used instead of glass fibers.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for the production of an orientation layer on a plane surface of at least one plate, where said plane surface is exposed to a diverging particle stream emanating from a source and impinging upon said plane surface under an angle of incidence $(\gamma) \neq 0°$, comprising:

providing a plate having a smooth surface.

introducing an aperture screen with an aperture between the source and the plate;

displacing the plate and the source relative to each other from a first position to a second position with approximately a constant velocity in a displacement direction that is parallel to said plane surface and substantially crosswise to the direction of the particle stream; and emanating through said aperture a particle stream from said source upon said smooth surface, said particle stream having a field limited on both sides in the displacement direction in such a way that the surface of the plate lies outside of the limited particle stream in the first and second positions and passes through the particle stream during the course of the displacement.

2. A process according to claim 1, wherein the displacing step comprises:

maintaining the source and the aperture fixed, and accomplishing relative displacement exclusively by moving the plate.

3. A process according to claim 2, comprising:

selecting a point source as said source, arranging the aperture so that the aperture lies symmetrical to a mid-plane passing through the source; and displacing the plate along a straight line which is perpendicular to the mid-plane.

4. A process according to claim 3, wherein said aperture is defined by perpendicular borders, two of which run parallel to each other and are aligned perpendicular to the displacement direction.

5. A process for the production of an orientation layer on a plane surface of at least one plate, where said plane surface is exposed to a diverging particle stream emanating from a source and impinging upon said plane surface under an angle of incidence $(\gamma) \neq 0°$, comprising:

introducing an aperture screen with an aperture between the source and the plate;

displacing the plate and the source relative to each other from a first position to a second position with approximately a constant velocity in a displacement direction that is parallel to said plane surface and substantially crosswise to the direction of the particle stream; and emanating through said aperture a particle stream from said source, said particle stream having a field limited on both sides in the displacement direction in such a way that the surface of the plate lies outside of the limited particle stream in the first and second positions and passes through the particle stream during the course of displacement;

wherein the displacing step comprises, selecting a point source as said source and maintaining the point source and the aperture fixed, arranging the aperture so that the aperture lies symmetrical to a mid-plane passing through the source, and displacing the plate along a straight line which is perpendicular to the mid-plane while maintaining the source fixed, and arranging the borders of the aperture in the region pertaining to the plate crosswise to the displacement direction, said borders assuming a shape such that the width (w) of the aperture measured in the displacement direction is approximately proportion to $(r^2/\sin \beta)(1/(r_m \cos \gamma_m))$, where r and $\beta$ are the polar coordinates of a point lying in the mid-plane and on the surface of the plate in a polar coordinate system which is defined with respect to the source, and where a straight line joining said point to the source cuts through the aperture at its own width (w), and where $r_m$ and $\gamma_m$ are the length and angle of incidence of a ray lying in the mid-plane of the particle stream and impinging on a horizontal midline of the plate on the surface of the plate.

6. A process for the production of an orientation layer on a plane surface of at least one plate, where said plane surface is exposed to a diverging particle stream emanating from a source and impinging upon said plane surface under an angle of incidence $(\gamma) \neq 0°$, comprising:

introducing an aperture screen with an aperture between the source and the plate;

displacing the plate and the source relative to each other from a first position to a second position with approximately a constant velocity in a displacement direction that is parallel to said plane surface and substantially crosswise to the direction of the particle stream; and emanating through said aperture a particle stream from said source, said particle stream having a field limited on both sides in the displacement direction in such a way that the surface of the plate lies outside of the limited particle stream in the first and second positions and passes through the particle stream during the course of displacement;

wherein the displacing step comprises, selecting a point source as said source and maintaining the point source and the aperture fixed, arranging the aperture so that the aperture lies symmetrical to a mid-plane passing through the source, and displacing the plane along a straight line which is perpendicular to the mid-plane while maintaining the source fixed; and providing a plate which is bowed concave with respect to the source during the displacement, wherein a line of intersection of the plate with the mid-plane essentially follows the curve of a logarithmic spiral of the form $r = r_o \exp((\beta - \beta_o)/\tan(90° - \Gamma))$, where r, $\beta$ and $r_o$, $\beta_o$ are the polar coordinates of two points lying on said line of intersection in a polar coordinate system defined with respect to the source, and $\gamma$ is the angle of incidence of the particle stream impinging on the point (r, $\beta$).

7. A process according to claim 6, wherein said aperture in a region pertaining to said plate includes a border arranged crosswise to the displacement direction, comprising:

providing said aperture with said crosswise arranged border shaped such that the width (w) of the aperture measured in the displacement direction is approximately proportional to $r/\sin \beta$, where r and $\beta$ are the polar coordinates of a point lying in the mid-plane and on the surface of the plate in a polar coordinate system which is defined with respect to the source, and where a straight line joining said point to the source cuts through the width (w) of the aperture.

8. A process according to claims 5 or 6, comprising:

arranging a plurality of plates one after the other in fan-like arrays crosswise to the displacement direction; and displacing each of said plates together at the same time.

9. A process according to claims 5 or 6, wherein said displacing step comprises:

moving the plate on a vehicle along at least one rail extending in the displacement direction.

10. A process according to claim 9, wherein the step of moving the vehicle comprises:

driving a fixed toothed pinion gear which engages with a toothed rack extending in the displacement direction and which is attached to the vehicle.

* * * * *